United States Patent
Hart et al.

(10) Patent No.: US 7,683,450 B2
(45) Date of Patent: Mar. 23, 2010

(54) METHOD FOR PRODUCING SMOOTH, DENSE OPTICAL FILMS

(75) Inventors: Gary Allen Hart, Walworth, NY (US); Robert LeRoy Maier, Ontario, NY (US); Jue Wang, Fairport, NY (US)

(73) Assignee: Corning Incorporated, Corning, NY (US)

( * ) Notice: Subject to any disclaimer, the term of this patent is extended or adjusted under 35 U.S.C. 154(b) by 5 days.

(21) Appl. No.: 12/267,005

(22) Filed: Nov. 7, 2008

(65) Prior Publication Data

US 2009/0097105 A1  Apr. 16, 2009

Related U.S. Application Data

(62) Division of application No. 11/510,140, filed on Aug. 25, 2006, now Pat. No. 7,465,681.

(51) Int. Cl.
  *H01L 31/0232* (2006.01)
(52) U.S. Cl. ............... 257/432; 257/E31.127
(58) Field of Classification Search .......... 257/22, 257/98, 103, 428, 432, 437, E31.127
See application file for complete search history.

(56) References Cited

U.S. PATENT DOCUMENTS

| 4,793,908 | A | 12/1988 | Scott et al. |
| 5,098,737 | A | 3/1992 | Collins et al. |
| 5,368,942 | A | 11/1994 | Smith et al. |
| 5,670,286 | A | 9/1997 | Takei et al. |
| 6,280,838 | B1 * | 8/2001 | Bernards et al. ............ 428/325 |
| 6,468,598 | B1 | 10/2002 | Hatakeyama et al. |
| 2001/0027025 | A1 | 10/2001 | Berkey et al. |
| 2002/0019303 | A1 | 2/2002 | Yamanaka et al. |
| 2005/0159002 | A1 | 7/2005 | Fork et al. |
| 2005/0266163 | A1 | 12/2005 | Wortman et al. |
| 2006/0046099 | A1 | 3/2006 | Maier et al. |

OTHER PUBLICATIONS

"Chemical Resistance of non-Lead Phosphate Sealing Glass", Liang Wen, et al American Ceramics Soc. Bulletin, vol. 85, No. 7.
"Lead Free Metallisation Paste For Crystalline Silicon Solar Cells: From Model to Result," Jaap hoornstra, et al 31st IEEE PVSC Florida 2005.
"Plasma display panel vacuum in-line sealing technology by using a bubble-reduced frit," San Jik Kwon, et al, J. Va. Sci. Tech. A 21(1) Jan./Feb. 2003.
"A comparative study of the UV optical and structural properties of $SiO_2$, $Al_2O_3$, and $HfO_2$ single layers deposited by reactive evaporation, ion-assisted deposition and plasma ion-assisted deposition," R. Theilsch, et al Thin Solid Films 410 (2002) 86-93.
"Very low-refractive index optical thin films consisting of an array of $SiO_2$ nanorods," J. Q. Xi, et al, Optics Letters, Mar. 1, 2006, vol. 31, No. 5.
"Employing oxygen-plasma posttreatment to improve the laser-indiced damage threshold of $ZrO_2$ films prepared by the electron-beam evaporation method," Dongping Zhang, Optics Letters, vol. 29, No. 24, Dec. 15, 2004.
"Oxygen plasma effects on sol-gel-derived lead-zirconate-titanate thin films," H. K. Jang, et al Applied Physics Letters, vol. 76, No. 7.

(Continued)

*Primary Examiner*—Quoc D Hoang
(74) *Attorney, Agent, or Firm*—Walter M. Douglas

(57) ABSTRACT

The invention is directed to preparing optical elements having a thin, smooth, dense coating or film thereon, and a method for making such coating or film. The coated element has a surface roughness of <1.0 nm rms. The coating materials include hafnium oxide or a mixture of hafnium oxide and another oxide material, for example silicon dioxide. The method includes the use of a reverse mask to deposit the coating or film on a rotating substrate.

6 Claims, 7 Drawing Sheets

OTHER PUBLICATIONS

"Proposed Square Spiral Microfabriation Architecture For Large Three-Dimensional Photonic Ban Gap Crystals," Ovidiu Toader, et al Science, vol. 292, May 11, 2001.

"Microstructure of vapour-deposited optical coatings," K. Guenther, et al Applied Optics, vol. 23, No. 21, Nov. 1, 1984.

"Ion-assisted deposition of moisture-stable hafnium oxide films for ultraviolet applications," Traci R. Jensen, et al, Jun. 1, 2002, vol. 41, No. 16, Applied Optics.

"Structural and optical modification in hafnium oxide thin films related to the momentum parameter transferred by ion beam assistance," M. Alvisi, et al Thin Solid Films 354 (1999) 19-23.

"GaInN light-emitting diode with conductive omnidirectional reflector having a low-refractive-index indium-tin oxide layer," Jong Kyu Kim, et al Applied Physical Letters, 88, 013501 (2006).

"Three-dimensional simulation of film microstructure produced by glancing angle depositon," T. Smy, et al J. Vac. Sci. Tech. A 18 (5) Sep./Oct. 2000.

"Controlled growth of periodic pillars by glancing angle depositon," B. Dick, J. Vac. Sci. Tech. B 21(1), Jan./Feb. 2003.

"Influence of AlN nucleation layer on the epitaxy of Gan/AiGaN high electron mobility transistor structure and wafer curvature," A. Torabi, et al.

"Investigation of substrate rotation at glancing incidence on thin-film morphology," B. Dick, J. Vac. Sci. Tech. B 21 (6), Nov./Dec.

"Sculptured thin films and glancing angle deposition: Growth mechanics and applications," K. Robbie, et al J. of Vac. Sci. Tech. A 15(3) May/Jun. 1997.

"Chiral mirror and optial resonator designs for circularly polarized light: suppression of cross-polarized reflectances and transmittances," Hodgkinson, et al Optics Communications 210, (2002) 201-211.

"Spectral-hole filter fabricated using sculptured thin0film technology," I. Hodgkinson, et al, Optics Communications, 177 (2002) 79-84.

"Anisotropic antireflection coatings: use as a laser intracavity polarization-direction selector,"I. J. Hodgkinson, et al Optics & Laser Technology 31 (1999) 295-298.

"The growth of nanoscale structured iron films by glancing angle depositon," F. Liu, Journal of Applied Physics vol. 85, No. 8, Apr. 15, 1999.

"Blending of nanoscale and microscale in uniform large-area sculptured thin-film architectures," M. Horn, et al, Institute of Physics Publishing, Nanotechnology 15 (2004) 303-310.

"The influence of ion mass and energy on the composition of IBAD oxide films," A. Rizzo, et al, Surfae and Coatings Technology 108-109 (1998) 297-302.

* cited by examiner 40 (Before)

x 1.00 µm/div
z 10.00 µm/div 42 (After)

METHOD FOR PRODUCING SMOOTH, DENSE OPTICAL FILMS

CROSS REFERENCE TO RELATED APPLICATION

This Application is a division of and claims the benefit of priority to U.S. patent application Ser. No. 11,510,140 filed on Aug. 25, 2006 now U.S. Pat No. 7,465,681, the content of which is relied on and incorporated herein by reference in its entirety

FIELD OF THE INVENTION

The invention is directed to a method for depositing thin optical films on optical substrates. In particular, the method is directed to a Plasma Ion Assisted Deposition ("PIAD") method of depositing thin optical films on optical filters and other optical elements that can be used in a wavelength range of approximately 200-375 nm.

BACKGROUND OF THE INVENTION

The deposition of thin optical thin films is known in the art and several different methods or technologies have been used to deposit such films. Among the employed that have been applied, all of which are carried out in vacuum, are (1) Conventional Deposition ("CD"), (2) Ion Assisted Deposition ("IAD"), (3) Ion Beam Sputtering ("or IBS"), and (4) Plasma Ion Assisted Deposition ("PIAD").

In Conventional Deposition (CD) method, materials are heated, in the presence of a substrate upon which a film to be deposited, to the molten state by either a resistance heating method or by electron bombardment. When molten, evaporation of the material occurs and a film is condensed on the surface of a substrate. At the molten material temperatures that are used by this method some disassociation of the evaporant takes place. While this dissociation is not a problem when an elemental material is being deposited (for example, elemental aluminum, silver, nickel, etc.), it does present a problem when the material to be deposited is a compound (for example, $SiO_2$, $HfO_2$). In the case of oxide materials, small amounts of oxygen are bled into the chamber during deposition in an attempt to re-store stoichiometry, a so-called reactive deposition. The films that are by the CD method are generally porous and lack sufficient kinetic energy (surface mobility) upon deposition to overcome surface energy (adhesion). Film growth is typically columnar (K. Gunther, *Applied Optics*, Vol. 23 (1984), pp. 3806-3816) with growth in the direction to the source and having a porosity that increases with increasing film thickness. In addition to high film porosity, other problems encountered with CD deposited films include index of refraction inhomogeneity, excessive top surface roughness, and weak absorption. Some improvements, though slight, are possible by adjusting the depositions rate and by increasing the substrate temperature during deposition. However, overall considerations of the final product dictate that CD techniques are not suitable for high quality optical components, for example, telecommunications elements, filters, laser components, and sensors.

Ion Assisted Deposition (IAD) is similar to the CD method described above, with the added feature that the film being deposited is bombarded with energetic ions of an inert gas (for example, argon) during the deposition process, plus some ionized oxygen (which in the case of oxide films is generally necessary to improve film stoichiometry). While ion energies are typically in the range 300 ev to 1000 ev, ion current at the substrate is low, typically a few micro-amps/cm². (IAD is thus a high voltage, low current density process.) The bombardment serves to transfer momentum to the depositing film and to provide sufficient surface mobility so that surface energies are overcome and dense, smooth films are produced. The index inhomogeneity and transparency of the deposited films are also improved and little or no substrate heating is required for the IAD method.

Ion Beam Sputtering (IBS) is a method in which an energetic ion beam (for example, argon ions in the range 500 ev-1500 ev) is directed to a target material, typically an oxide material. The momentum transferred upon impact is sufficient to sputter-off target material to a substrate where it is deposited as a smooth, dense film. Sputtered material arrives at the substrate with high energy, perhaps several hundred electron volts leading to high packing density and smooth surface, but high absorption of the deposited films is a common by-product of the IAB process. As a result, an IBS process might also include an IAD source to both improve stoichiometry and absorption. While the IBS process is an improvement over CD and IAD, there are nonetheless problems with IBS. Such problems with the IBS deposition process include: (1) the deposition process is very slow; (2) it is more of a laboratory technique than a production process; (3) there are few IBS installations in existence, typically remnants from the telecom bubble and having one or two machines operated by a small staff; (4) substrate capacity is quite limited; (5) deposition uniformity over the substrate can become a limitation thus affect product quality and resulting in a high discard rate; (6) as the target is eroded the uniformity of the film being deposited changes, thus resulting in further quality problems and frequent target change-outs with associated down-time and costs; and (7) the bombardment energy is quite high, leading to disassociation of the deposited materials and hence absorption.

Plasma Ion Assisted Deposition (PIAD) is similar to the IAD process above, except momentum is transferred to the depositing film via a low voltage, but high current density plasma. Typical bias voltages are in the range 90-160 v and current densities in the range of milli-amps/cm². While PIAD instruments are common in the precision optics industry and have been used to deposit films, there are some problems with the PIAD method, particularly in regard to the homogeneity of the deposited film.

While the above method for depositing films have all been used in the optics industry, all of them currently present problems. Consequently, there is a need for either a new process or improvements in the existing processes. In particular, there is a need for a process than can produce smooth and dense films.

SUMMARY OF THE INVENTION

In one aspect the invention is directed to a method of depositing a thin film of a selected material on the surface of a substrate using plasma ion assisted deposition (PIAD), the method having the steps of:

providing a vacuum chamber and within said chamber:

providing a substrate on which a coating is to be deposited;

providing at least one selected coating material source, or a mixture of coating materials source, and vaporizing said material(s) used an e-beam to provide a coating material vapor flux, said flux passing from said material source through a reversed mask to said substrate;

providing plasma ions from a plasma source;

rotating said substrate at a selected rotation frequency f; and depositing said coating material on said substrate and bombarding said substrate and said deposited materials with said plasma ions before and during said material deposition process.

In one aspect the plasma ions are formed from a plasma gas selected from the Noble gas group (Ar, Kr, Xe, Ne) group or a mixture of a Noble gas with oxygen. In another aspect the plasma ions are formed from a plasma gas, said plasma gas is selected from the group of argon, xenon, and a mixture of argon or xenon with oxygen.

In another aspect the invention is directed to a method of preparing a silica optical element having a coating of $Al_2O_3$, $SiO_2$, $HfO_2$, $Si_3N_4$, $TiO2$ and $ZrO_2$, and mixtures of the foregoing, for example, $SiO_2/HfO_2$, $HfO_2/TiO_2$, $SiO_2/ZrO_2$ and $SiO_2/TiO_2$.

In another aspect the invention is directed to substrate having a smooth, dense, thin coating of a selected material thereon The coating materials can be oxides and nitrides of metallic elements; for example, $Al_2O_3$, $SiO_2$, $HfO_2$, $Si_3N_4$, $TiO2$ and $ZrO_2$, and mixtures of the foregoing, for example, $SiO_2/HfO_2$, $SiO_2/ZrO_2$ and $SiO_2/TiO_2$. The substrate is any substrate transmissive to electromagnetic radiation in the range of approximately 200 nm to approximately 400 nm; for example, $SiO_2$ (silica), fused silica and silica doped with selected element, for example fluorine and titania, as well as fluoride substrates, for example, $CaF_2$ and $MgF_2$.

The invention is also directed to an optical element comprising a substrate and a smooth, dense, thin coating of a selected material on said substrate to thereby form a coated substrate; the coated substrate being transmissive to electromagnetic radiation in the range of approximately 200 nm to approximately 400 nm and having a coated surface roughness of <1.0 nm rms. In preferred embodiments the surface roughness of is <0.5 nm rms.

DETAILED DESCRIPTION OF THE INVENTION

Figure 1:
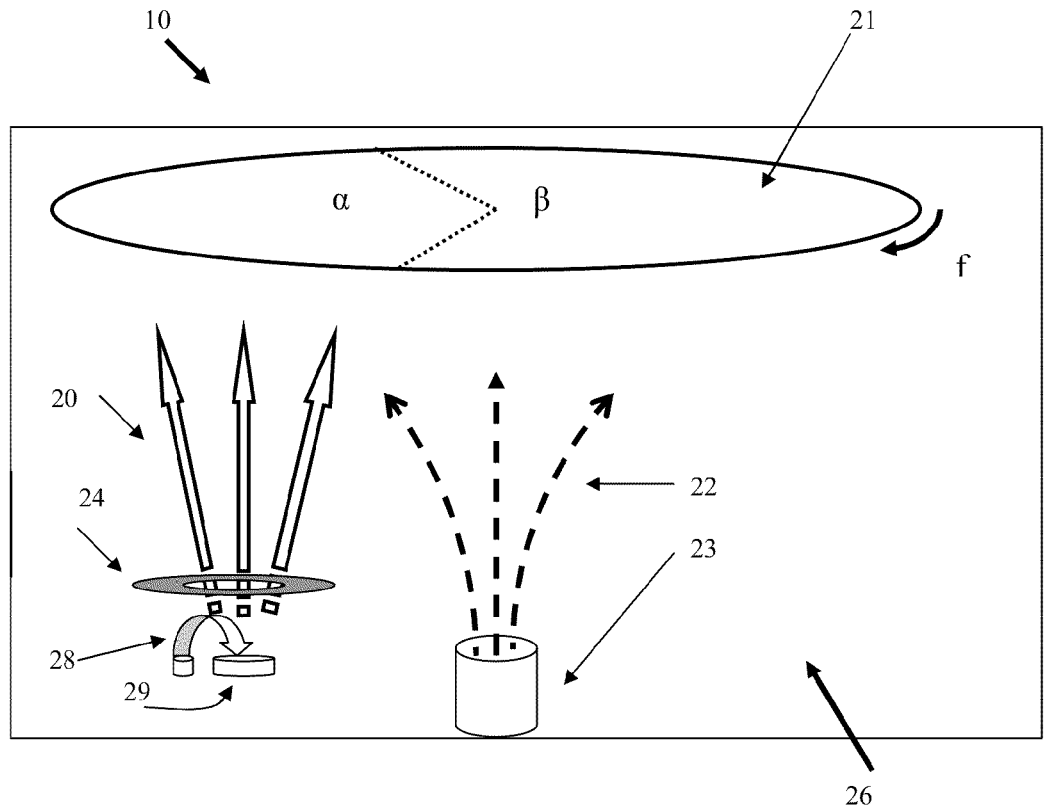
FIG. 1 is a diagram illustrating the general set-up for depositing thin films in accordance with the invention.

Referring to FIG. 1, as used herein the terms "reversed mask" and "regular" means as follows. A regular mask is a piece of material that is sitting above the depositing source which enables one to improve deposited film uniformity by changing its shape. A "reversed mask" is one in which the mask has a hole in the center. That is, the vapor flux 20 created by bombarding the coating material 29 with an e-beam passes through a mask 24 that restricts the flux to being deposited on the rotating substrate 21 in the restricted area α as illustrated in FIG. 1. The rotation of the substrate (rotation mechanism not illustrated) insures that with time the entire substrate will be coated with the coating material. Since the "α area" is in fact a stationary feature because it is defined by the flux deposition area, as the substrate rotates the deposited material leaves this area and eventually enter into the β area. When the coating is in the β area, the plasma ion "beam" impacts the coating, densifying and smoothing it. Deposition takes place only in area α, while plasma bombardment takes place in areas α and β. The plasma beam can be used while rotating the substrate for a time in the range of >0-10 minutes, preferably a time in the range of 1-5 minutes, prior to beginning the coating deposition to insure that the entire substrate surface is densified and smoothed prior to coating deposition. As the process proceeds, each layer of coating is impacted and densified. Owing to the rotation speed f (f is in the range of 4-20 rpm, preferably 12-15 rpm) and to the deposition rate (the deposition rate is in the range of 0.05 nm/sec to 10 nm/sec, preferably in the range 0.7-2.0 nm/sec) the densification and smoothing is virtually on an atomic layer by atomic layer basis. An example of rotation speed and deposition rate as used herein is f=14 rpm and a deposition rate of 0.1 nm/sec. When a "regular mask" is used, the coating material flux is spread out such that all or substantially all of the substrate surface area is simultaneously coated. The plasma beam will impact the coating as it is deposited. While this may densify the coating, it does not smooth it as is illustrated by the FIGS. 8 and 10.

The present invention is directed to a method for producing thin optical films on a substrate and an optical element having a thin optical film thereon that has improved performance characteristics; for example without limitation, durability, decreased inhomogeneity and better index of refraction. The method of the invention is suitable for producing UV high frequency pass optical filters (for example those operating in the 245-325 nm range), especially for filters that necessitate the use of combinations of $SiO_2$ and $HfO_2$ for thin film deposition because of transparency and index of refraction requirements. The method of the invention can be used to deposit oxide and nitride films, for example films of $Al_2O_3$, $SiO_2$, $HfO_2$, $Si_3N_4$, $TiO2$, and $ZrO_2$ and mixtures (of any composition) of the foregoing, for example, $SiO_2/HfO_2$, $SiO_2/ZrO_2$ and $SiO_2/TiO_2$. Hafnium oxide, $HfO_2$, is a particularly useful coating material, but is also very difficult to deposit, either alone or in combination with other materials such as $SiO_2$. In fact, many of those skilled in the art have believed that only the IBS process could produce $HfO_2$ and $HfO_2/SiO_2$ film combinations that have sufficient smoothness and are of sufficiently low scatter so as to meet the UV detection requirements of many applications, for example, UV detection of anti-aircraft missiles. The present invention produces such films.

The present invention uses a PIAD method that produces films that are at least equivalent to those produced by the IBS method in terms of smoothness, transparency and light scattering, but without the IBS-associated problems that have previously been described. A PIAD-based method will possess numerous advantages including (1) they require only about half the time to make a deposition run as other methods; (2) the machines are quite common in the precision optics industry; (3) the substrate capacity can be much greater, approximately 3-4 times, than the capacity of other methods; (4) while uniformity may sometimes still be an issue, there are methods to deal with it and produce uniform thin films; and (5) PIAD is a reactive process with high ion current density and low ion energy, so any disassociation is quite minimal and is corrected for as part of the process.

The method of the invention uses a PIAD process having the novel features of (1) restricting the deposition angle-of-incidence of the material being deposited on a substrate and (2) using the PIAD plasma to continuously smooth the film during deposition. These two techniques have been found to be complimentary to one another. The method of the invention is particularly beneficial for the deposition of both materials which may prefer to grow in a crystalline manner such as $HfO_2$ and amorphous materials such as $SiO_2$.

It is well known that optical interference coatings for UV applications have to meet a variety of specific requirements; for example, low absorption, low scattering loss and long-term optical stability. In order to achieve these properties, either ion or plasma ion bombardment has been well accepted and widely used by optical coating industry. When these process are used, the key process challenge is "how to make film as compact as possible while keeping chemical composition unchanged". R. Thielsch, Thin Solid Films, Vol. 410 (2002), pp 86-93, has reported that the surface roughness of PIAD-deposited $SiO_2$ coatings is a function of bias voltage. It is only at a bias voltage higher than 150V that the surface roughness of the PIAD-coating can be lower than the roughness of the standard polished fused-silica substrate. Although the coating has high packing density close to 1, IR spectroscopic investigations have revealed that the composition of the coating is slightly oxygen-deficient. The results also suggest that even for amorphous $SiO_2$ one still needs to balance the optical loss between scattering and absorption for UV and DUV applications. A. Rizzo, Surface and Coating Technology, Vols. 108-109 (1998), pp. 297-302, investigated the influence of ion mass (Ar, Xe) and energy (100-1000 eV) on the composition of an $HfO_2$ film. By bombarding using Xe ions instead of Ar ions, an enhanced quality $HfO_2$ film can be achieved in a narrow energy window. M. Alvisi, Thin Solid Films, Vol. 354 (1999), pp. 19-23, further revealed that the optical and micro-structural properties of $HfO_2$ film are strongly related to the Xe ion momentum transferring to the growing film. A three-step transition from a random monoclinic phase, via amorphous phase, up to a highly phase orientated fiber texture has been reported. Jensen, Applied Optics, Vol. 41 (2002), pp. 3205-3210, took a design-of-experiments statistical approach to determine the optimum ion-gun operating parameters for the deposition of moisture-stable $HfO_2$ films by Ar ion-assisted electron-beam evaporation using a bias voltage ranging from 135 to 400 V. X-ray diffraction measurements show that the ion-assisted films exhibit a partial monoclinic crystalline structure, whereas the unassisted films are porous and amorphous. The conclusion of the foregoing brief review of the technical literature is that previous research was not able to obtain compacted amorphous oxide film without causing chemical composition change. That is, the resulting films, $SiO_2$ and $HfO_2$, were not compact and stoichiometric. The present invention enables one to obtain amorphous, smooth and dense oxide films while retaining the coating composition stoichiometry whether one uses $SiO_2$ and $HfO_2$, or mixtures thereof, or other oxide materials such as $TiO_2$, $Al_2O_3$ and other oxides described herein or know in the art as being useful for optical coatings. The substrate can be any substrate upon which a film can be deposited, including those that are not transmissive to infrared, visible and ultraviolet radiation such as metal and metalloid (for example, silicon) surfaces. Examples of substrates transmissive to infrared, visible and ultraviolet radiation that can be used in practicing the invention include silica ($SiO_2$), fused silica, alkaline metal fluoride single crystals and mixed alkaline metal fluoride single crystals ($MgF_2$, $CaF_2$, $SrF_2$, $BaF_2$, and mixed single crystals thereof), fluorine doped fused silica, and silica or fused silica doped with substances selected from the group consisting of at least one from the group consisting of $TiO_2$, $Al_2O_3$, $SnO_2$, $ZrO_2$, optical glasses. silicon, germanium, and ZnS, ZnSe and $As_2O_3$ chalcogenide glasses.

The Interaction of Plasma Ion with Deposition Film

It is known that the deposition flux distribution and its interaction with plasma ion play a key role for film microstructure improvement. FIG. 1 illustrates a deposition set-up 10 having a vacuum chamber 26 in which is located a substrate 21, an e-beam 28 that impinges a target 29 to produce a vapor flux 20 that passes through a reversed mask 24 for deposition on the substrate 21. In addition, there is plasma source 23 that generates plasma 22. As schematically illustrated in FIG. 1, there are two zones, α and β, where the mechanism of plasma ion interaction with deposition materials significantly differs from each other. In the zone α, the plasma ion bombards the deposition atoms simultaneously and momentum is transferred leading to compacted dense layer. In zone β, the plasma ions continuously collide with the deposited surface where no deposition occurs and momentum is transferred resulting in a smooth coating surface. The overall coating processes can be described by the momentum transfer per deposited atom P as the addition of momentum transfer in zone α ($P_α$) and zone β ($P_β$) in unit of $(a.u. eV)^{0.5}$ during coating process as shown by Equation (1), $$P = P_\alpha + P_\beta = \frac{1}{2\pi}\left(\frac{\alpha}{R}\kappa + \frac{\beta}{n_s f}\right) J_i \sqrt{2m_i e V_b} \quad (1)$$

where $V_b$ is the bias voltage, $J_i$ and $m_i$ is the plasma ion flux in ion/($cm^2$ sec) and mass in a.u. (atomic units), respectively. Additionally, R is the deposition rate in nm/sec; e is the electron charge; k is a unit conversion factor; $n_s$ is the surface atom density of the deposited film in atom/$cm^2$; and β and α are the radian of the shielded and unshielded areas relative to the center of the rotated plate with a frequency f. By adjusting the reversed mask shape and height, APS (advanced plasma source) parameters and plate rotation frequency, one can separately control the amount of momentum transfer for plasma assisted deposition and for plasma smoothing. Equation (1) can also be used to describe a typical PIAD standard setup, where α and β equal ~2π and ~zero, respectively. In this case, the plasma momentum transfer only assists film deposition, whereas the second term for smoothing is almost zero.

Dense Film Deposition by Restricting High Angle of Incidence

It is also known that oblique-angle deposition is a method that can be used to grow thin films with a porous microstructure. By taking advantages of the self-shadowing effect during the deposition process, nano-porous thin films have been developed by a number of parties seeking fundamental understanding of the nanostructure formation [see Robbie, J. Vac Sci. Technol. A, Vol. 15(3) (1997), pp. 1460-1465; Liu, J. Appl. Phys., Vol. 85(8) (1999), pp 5486-5488; Hodgkinson, Microelectronic Engineering, Vol. 57-58 (2001), pp. 833-836; Dick, J. Vac Sci. Technol. B, Vol. 21(1) (2003), pp.

Figure 2:
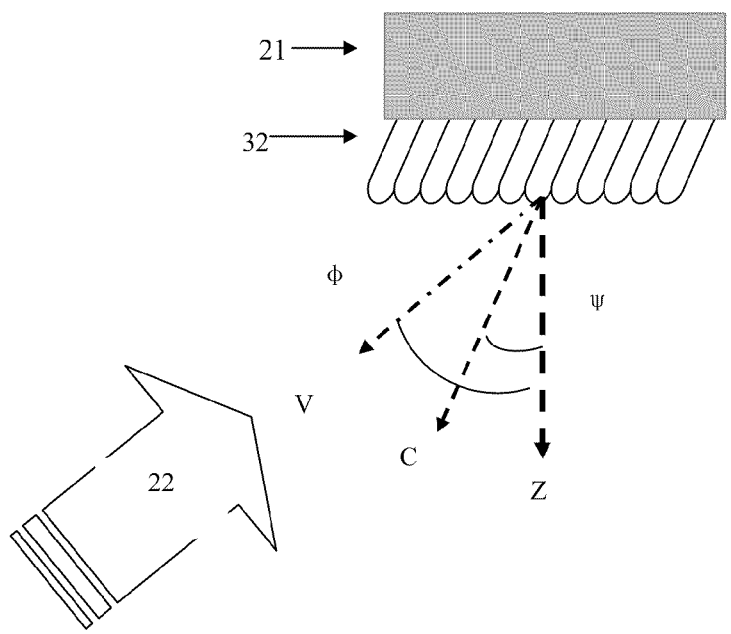
FIG. 2 is a diagram illustrating deposition vapor flux and film orientation.

23-28, and Vol. 21(6) (2003), pp. 2569-2575; Smy, J. Vac Sci. Technol. A, Vol. 18(5) (2000), pp. 2507-2512; Horn, Nanotechnology, Vol. 15 (2004), pp. 303-310; _2004,)] and for various applications such as optical filters and polarizers [see Hodgkinson, Optics & Laser Technology, Vol. 31 (1999), pp. 295-298; Hodgkinson, Optics Communications, Vol. 177 (2000), pp. 79-84 and Vol. 210 (2002), pp. 201-211], reflectors [Kim, Appl. Phys Lett., Vol. 88 (2006), p. 13501], photonic crystals [Toader, Science, Vol. 292 (2001), pp. 1133-1135; and Kennedy, J. Vac Sci. Technol. B, Vol. 22(3), pp. 1184-1190]. Recently, Xi, Optics Letters, Vol. 31 (2006), pp. 601-601, demonstrated that the refractive index of nano-porous $SiO_2$ thin film can be as low as 1.08 at a wavelength of 700 nm. In addition, in our practice it has been well understood that elimination of nano-porous structure of multilayer coating is crucial for low loss UV and DUV optics. However, as disclosed herein, it was found that the mechanism of nano-porous structure formation in oblique-angle deposition could enable one to make dense smooth multilayer coatings if it was properly applied. FIG. 2 is a schematic diagram of deposition vapor flux 22 ("V") and film columnar orientation ("C"), assuming the film 32 is deposited onto a stationary substrate 21 with the flux arriving at an angle of $\phi$ [vapor flux angle] from substrate 21 normal ("Z") under conditions of limited atom diffusion. As a result, a columnar microstructure C of the deposited film is formed with an inclination angle of $\psi$ as illustrated in FIG. 2. The column inclination angle $\psi$ lies between the film normal Z and the vapor flux incidence angle $\phi$ and is dependent upon many deposition parameters, including deposited material, substrate temperature, angular distribution of the deposition flux, background gas pressure and composition and plasma momentum transfer. The rotation frequency f has value in the range of 4 to 20 rpm. A preferred range is 12 to 15 rpm. An exemplary rate is 14 rpm.

Figure 3:
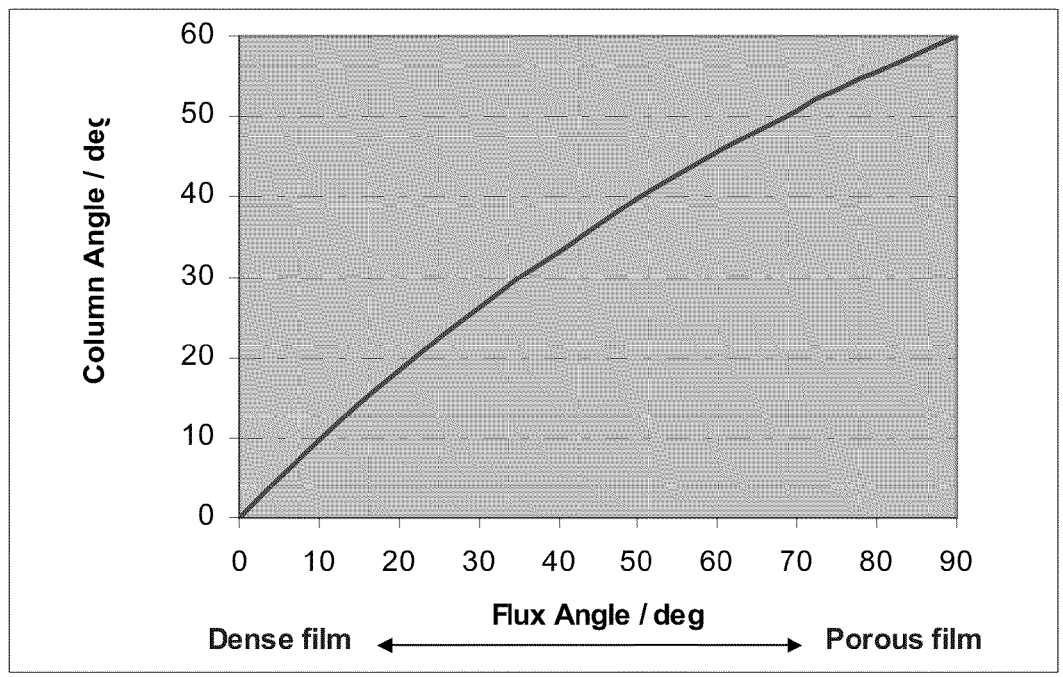
FIG. 3 is a graph illustrating film column structure growth angle as a function of vapor flux angle

In general, there is a relationship between vapor flux angle $\phi$ and column angle $\psi$ for a giving set of deposition conditions, the column angle $\psi$ is uniquely determined by the deposition angle $\phi$. FIG. 3 is a graph showing film column structure growth angle $\phi$ vs. vapor flux angle $\phi$. As illustrated, the film density decreases with increased vapor flux angle $\phi$. In practice, the vapor flux angle $\phi$ varies from 10° to 45° during deposition. The deposited film contains various column inclination angles $\psi$ ranging from 10° to 37°. By restricting high deposition angle $\phi$ to $\leq 20°$ as schematically illustrated in FIG. 2, the column inclination angle $\psi$ is restricted to an angle between 0° to 18° in the deposited film. As a consequence of the reducing column inclination angle $\psi$ being restricted, the deposited film density is improved. On the other hand, the plasma assist is more effective in zone a to make densified film when the column inclination angle is small.

Smooth Film Deposition by Means of In-Situ Atomic Scale Plasma Smoothing

Figure 4:
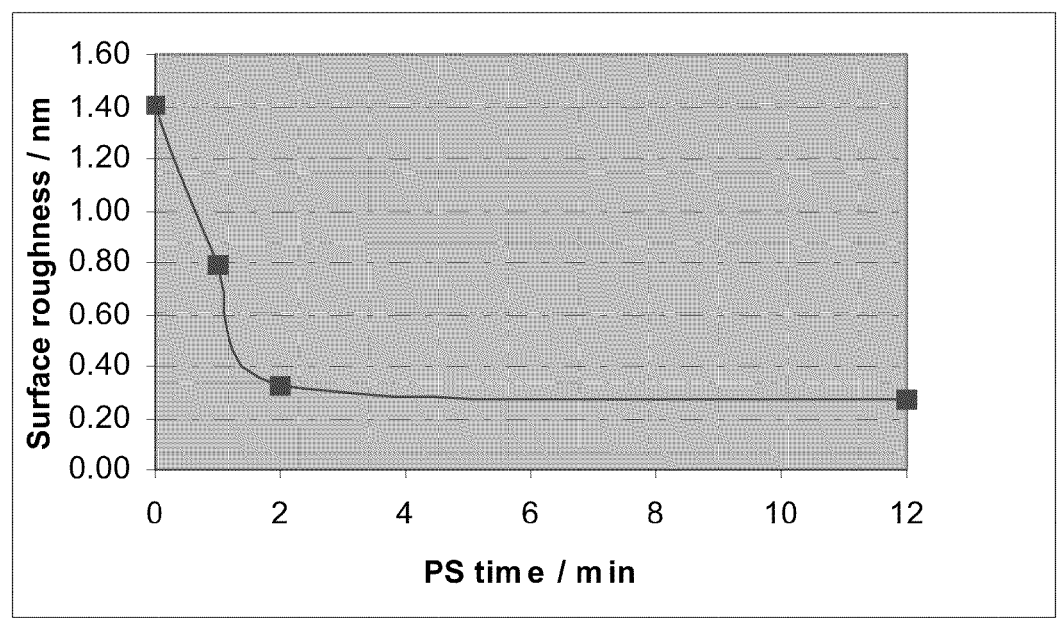
FIG. 4 is a graph illustrating four ellipsometric modeled surface roughness of $HfO_2$ single layer as a function of plasma smoothing ("PS") time.

As described in Equation (1), the interaction of plasma with the deposited surface continues within zone β where no deposition occurs and only plasma smoothing is taking place. The plasma smoothing effect can be demonstrated by prolonging plasma treatment on a standard plasma assisted film. FIG. 4 is a graph illustrating the ellipsometric modeled surface roughness of an $HfO_2$ single layer as a function of plasma smoothing (PS) time. As can be seen, the surface roughness decreases abruptly within 2 minutes of plasma smoothing. Prolonged plasma smoothing (the time after the first 2 minutes) is not as effective as in the early stage. (Overall, plasma smoothing time is in the range of >0-10 minutes, preferably in the range of 1-4 minutes. Plasma smoothing can be carried out on the substrate before the deposition of any coating materials or film, and additional smoothing can be carried out after the coating or film has been completely deposited on the substrate.) Table 1 lists both the $HfO_2$ layer thickness and surface roughness as a function of plasma smoothing (PS) time. The ellipsometric modeling suggests that plasma smoothing removes a few nanometers of material as a consequence of plasma-surface interaction. Both ellipsometric modeling and AFM measurements show the reduction of the surface roughness.

TABLE 1

| PS Time at 140 V (min | Total D (nm) | Roughness Modeled (nm) | TMS AFM (nm) |
|---|---|---|---|
| 0 | 164.08 | 1.41 | 1.61 |
| 1 | 163.80 | 0.78 | 0.98 |
| 2 | 163.00 | 0.33 | 0.97 |
| 12 | 161.77 | 0.27 | 0.61 |

Figure 5:
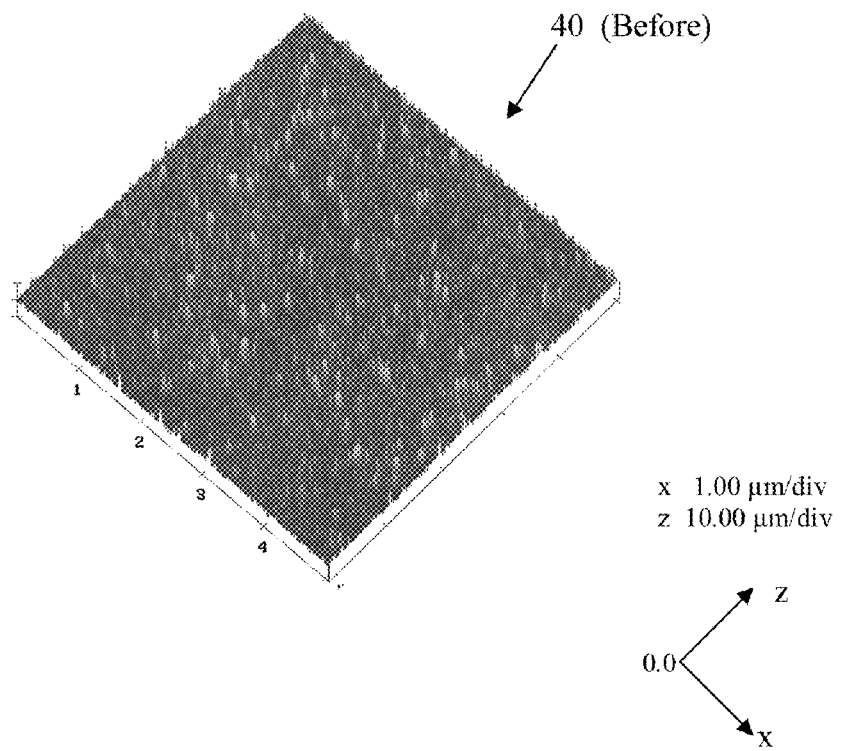
FIG. 5 illustrates an $HfO_2$ layer before and after plasma smoothing.
Figure 5:
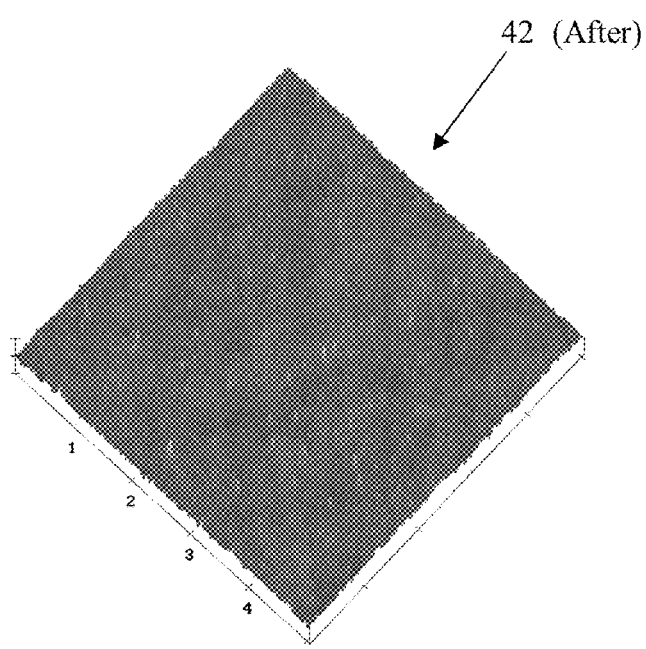
Figure 6:
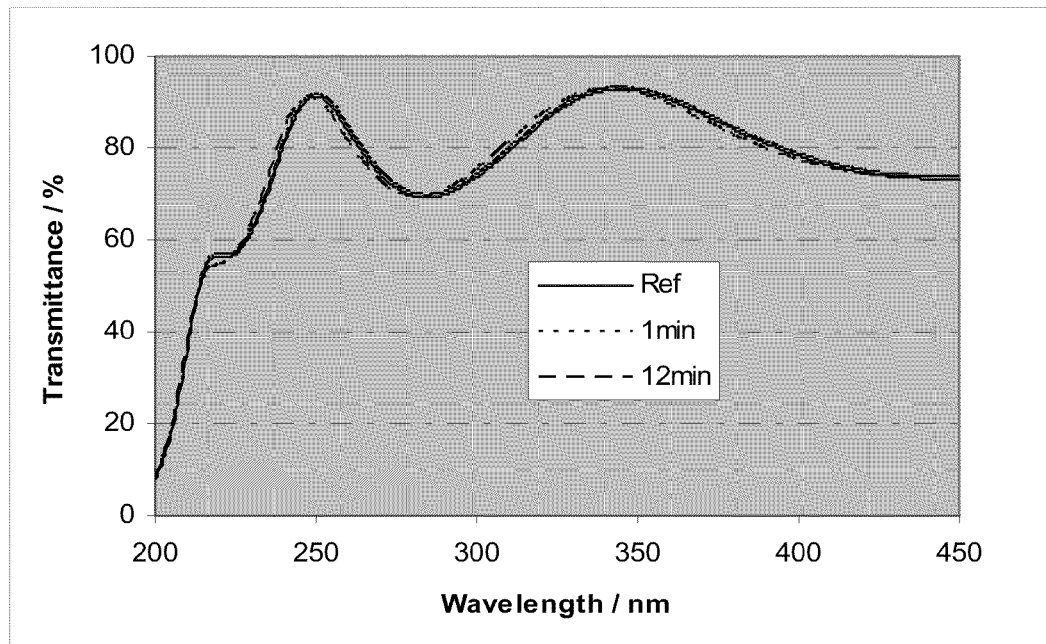
FIG. 6 is a graph illustrating the transmittance of an $HfO_2$ single layer before and after twelve minutes of plasma smoothing.
Figure 7:
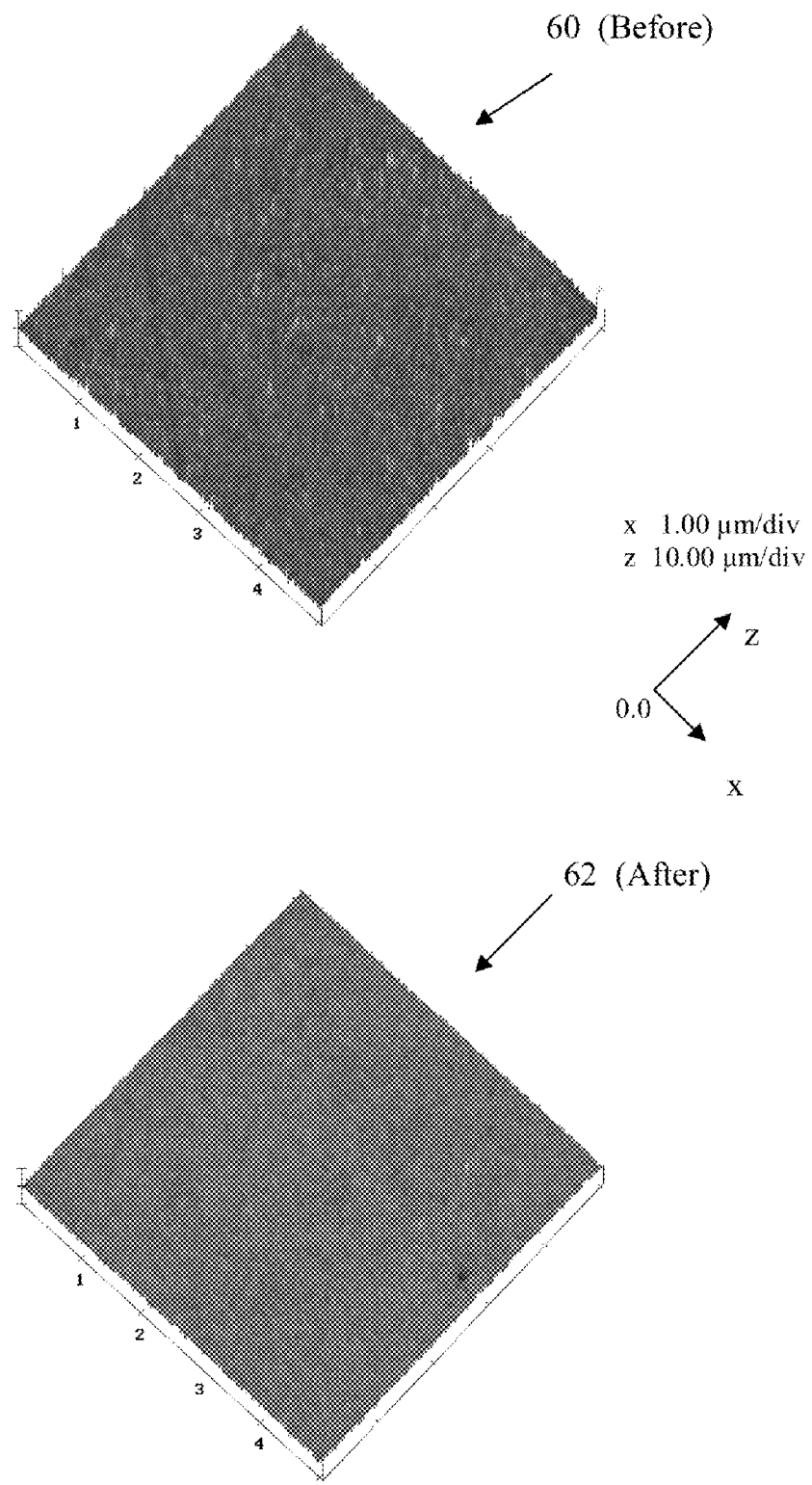
FIG. 7 illustrates a $SiO_2$ layer before and after plasma smoothing.

FIG. 5 shows AFM (Atomic Force Microscopy) images of the $HfO_2$ single layer before (40, top figure) and after 12 min (42, bottom figure) plasma smoothing. The surface roughness is reduced from an initial value of 1.61 nm to a final value of 0.61 nm. FIG. 6 shows spectral transmittance of $HfO_2$ single layer before and after 1 minute and 12 minutes of plasma smoothing. Since the working gas was a mixture of Ar and $O_2$, the plasma smoothing improves the high spatial frequency feature (shown in FIG. 5) of the $HfO_2$ film without introducing noticeable absorption. The same approach has been applied to $SiO_2$ single layer. FIG. 7 shows AFM images of 60 nm $SiO_2$ layer before (60, top figure) and after (62, bottom figure) plasma smoothing. The results suggest that high spatial frequency structure is significantly reduced due to the plasma interacting with the deposited film surface without altering the film volume property or properties.

Oxygen plasma effects on both sol-gel derived and electron-beam evaporate oxide films have been reported by Jang et al., Appl. Phys Lett., Vol. 76 (2000), pp. 882-884, and Zhang et al., Optics Lett., Vol. 29 (2004), pp. 22870-2872. Jang et al found that oxygen plasma treatment on ferroelectric PZT films leads to improved electrical characteristics. Zhang et al claimed that employing oxygen-plasma post-treatment raises laser-induced damage threshold of $ZrO_2$ film to 23.1 J/cm$^2$ from 15.9 J/cm$^2$, presumably due to the reduction of microdefect density and absorption. However, in both cases no surface morphology investigation was performed.

Improved Film Microstructure and Optical Performance

The installation of reversed mask restricts deposition angle within zone α and simultaneously introduces in situ plasma smoothing within zone β where plasma smoothing successively takes effect for the deposited film surface on nearly an atomic layer basis.

As a result of such setup, one might expect improved smoothness at the film surface as well as homogeneity in the film volume. Tables 2 and 3 list a comparison of 167 nm $HfO_2$ single layer and 259.5 nm $SiO_2$ single layer deposited with reversed masks and regular masks, respectively. The results further confirm improved film microstructure with restriction of deposition angle and in situ plasma smoothing for both $HfO_2$ and $SiO_2$ single layer.

TABLE 2

Improved 167 nm HfO$_2$ Single Layer

| | Mask | |
| --- | --- | --- |
| | Reversed | Regular |
| Run k8-1 | 935 | 882 |
| RMS (AFR) | 0.43 | 1.03 |
| n at 317 nm | 2.191 | 2.165 |
| Δn/n | 1.2% | baseline |
| index inhomogeneity | −0.14% | −0.89% |

TABLE 3

Improved 259.5 nm SiO$_2$ Single Layer

| | Mask | |
| --- | --- | --- |
| | Reversed | Regular |
| Run k8-2 | 957 | 885 |
| RMS (AFR) | 0.69 | 0.83 |
| n at 317 nm | 1.498 | 1.497 |
| Δn/n | 0.1% | baseline |

Figure 9:
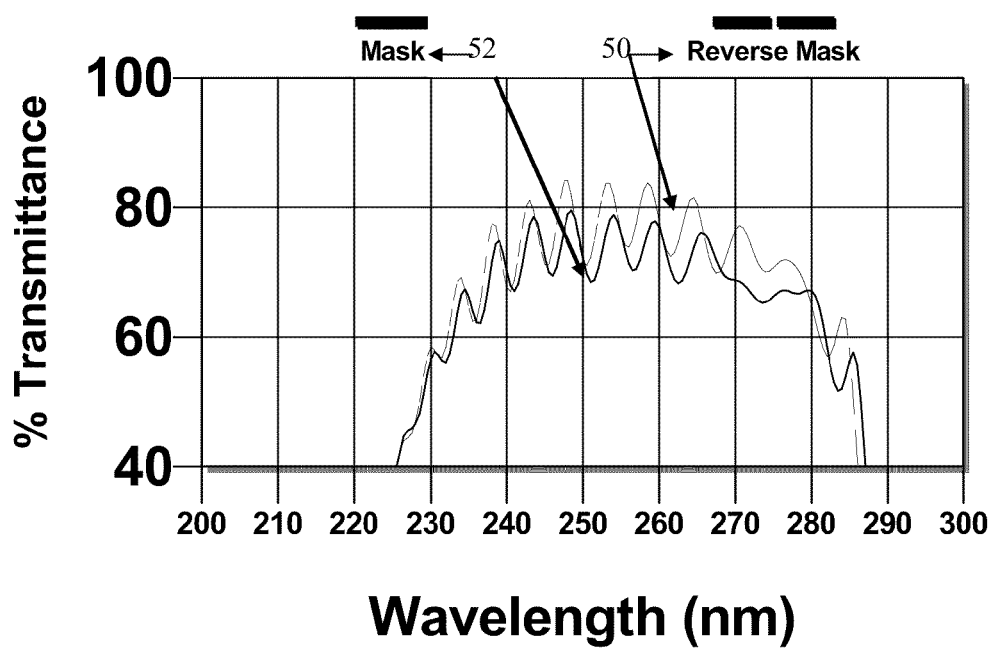
FIG. 9 illustrates the transmittance of a 52-layer $SiO_2/HfO_2$ film deposited with reverse masks (dashed line) and regular masks (solid line).
Figure 8:
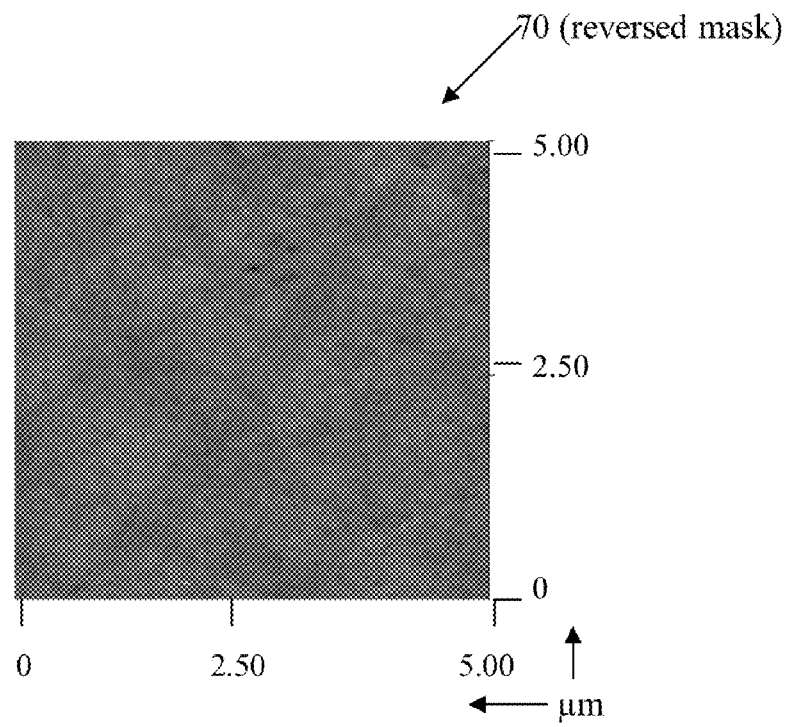
FIG. 8 illustrates the roughness of a 52-layer $SiO_2/HfO_2$ film deposited with reverse masks (left side) and regular masks (right side).
Figure 8:
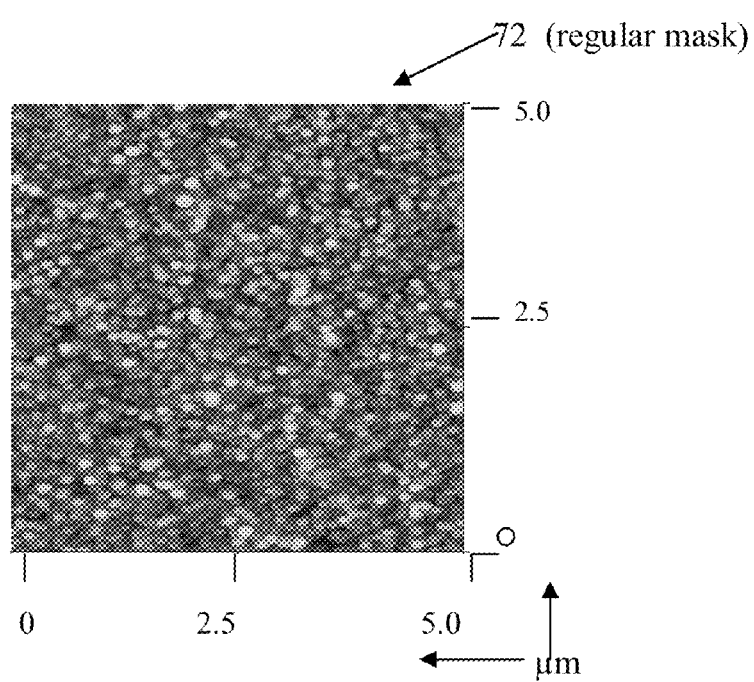

FIG. 8 shows AFM images of a 52-layer SiO2/HfO2 deposited with reversed mask (70, top figure) and regular mask (72, bottom figure). The surface roughness was reduced from an initial value of 1.98 nm (bottom figure) to a final value of 0.44 nm (top figure). FIG. 9 illustrates the spectral transmittance of 52-layer SiO$_2$/HfO$_2$ deposited with reversed masks 50 and regular masks 52. When the reversed mask is used the spectral transmission increases by approximately 4-5% in the spectral region of 250 nm to 285 nm, and the results confirm the film structure improvement. Generally, the surface roughness of films prepared in accordance with the invention as described herein have a surface roughness of <1.0 nm rms, and typically a surface roughness of <0.5 nm rms.

Figure 10:
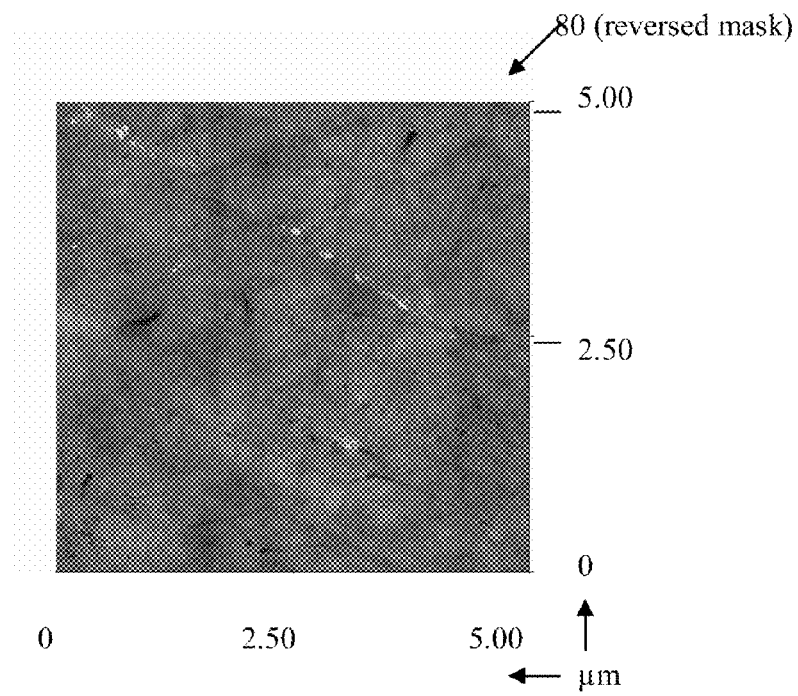
FIG. 10 illustrates an $Al_2O_3$ single layer deposited with reverse masks (left side) and regular masks (right side).
Figure 10:
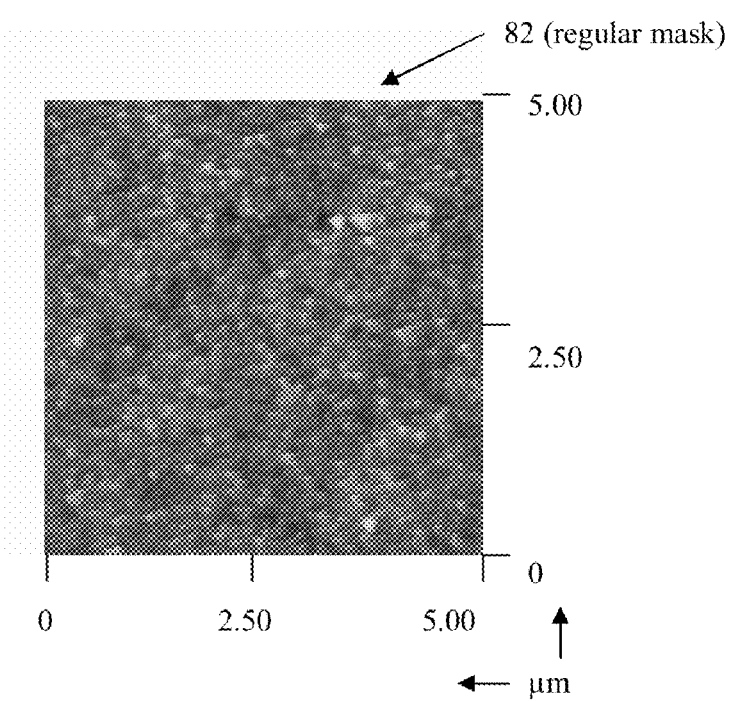

Based on the data disclosed herein, the method of the invention can be applied not only to HfO$_2$ and SiO$_2$ coating materials, included mixtures thereof, but also to other coating materials as have been mentioned elsewhere herein. These coating materials further include, without limitation, Al$_2$O$_3$, ZrO$_2$, TiO$_2$, Ta$_2$O$_5$, ScO$_2$, Y$_2$O$_3$ and mixtures of any of such materials. As an example, Table 4 presents results for the deposition of an Al$_2$O$_3$ single layer. FIG. 10 shows AFM images of Al$_2$O$_3$ single layer deposited with reversed masks (top figure) and regular masks bottom figure). The surface roughness was reduced from an initial value of 0.59 nm (bottom figure) to a final value of 0.29 nm (top figure).

In practicing the invention the plasma ions are formed from a plasma gas selected from the Noble gas group (Ar, Kr, Xe, Ne) group or a mixture of a Noble gas with oxygen. In one aspect the plasma ions are formed from a plasma gas, said plasma gas is selected from the group of argon, xenon, and a mixture of argon or xenon with oxygen. The amount of oxygen that is present depends on the raw starting raw materials that are used to form the coating. For example, if an HfO$_2$ coating is desired, one can start with either Hf metal or HfO$_2$ as the material source that is bombarded by the e-beam. Other oxide coatings can also be formed starting from either a metal or metalloid material as are mentioned above. For all of these the amount of oxygen in the plasma gas ranges from 15% to 60% by volume. Gas flows during deposition were measured in SCCM units (standard cubic centimeters per minute). As an example, when silica was used as the coating material, 12 SCCM argon and 6 SCCM oxygen was used, When HfO$_2$ was used as the coating material, 17 SCCM argon and 25 SCCM oxygen was used. Addition of the plasma gasses raises the base pressure in the chamber fro approximately 5×10$^{-6}$ mbar to approximately 3-4×10$^{-4}$ mbar during the deposition cycles.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

We claim:

1. An optical element comprising a substrate and a smooth, dense, thin coating of a selected material on said substrate to thereby form a coated substrate:
   said coated substrate being transmissive to electromagnetic radiation in the range of approximately 200 nm to approximately 400 nm; and
   said coated substrate having a coated surface roughness of <1.0 nm rms, wherein said smooth, dense, thin coating is a combination of SiO$_2$ and HfO$_2$.

2. The optical element according to claim 1, wherein the coated surface roughness is <0.5 nm rms.

3. The optical element according to claim 1, where said substrate is selected from the group consisting of silicon, silica, fused silica, optical glasses, germanium, fluorine doped fused silica, TiO$_2$ doped silica and TiO$_2$ doped fused silica, and ZnSe, As$_2$S$_3$ and ZnS chalcogenide glasses.

4. The optical element according to claim 1, wherein coating material is an oxide selected from the group consisting of Al$_2$O$_3$, SiO$_2$, HfO$_2$, TiO2 and ZrO$_2$, and mixtures of at least two of the foregoing.

5. The optical element according to claim 1, wherein said element is a UV high frequency pass optical filter operating in the 245-325 nm range.

6. The optical element according to claim 1, wherein said element is a UV high frequency pass optical filter operating in the 245-325 nm range.

\* \* \* \* \*